US008106461B2

(12) United States Patent
Chen et al.

(10) Patent No.: US 8,106,461 B2
(45) Date of Patent: Jan. 31, 2012

(54) APPARATUS FOR NBTI PREDICTION

(75) Inventors: Chia-Lin Chen, Jhubei (TW); Yi-Miaw Lin, Banciao (TW); Ming-Chen Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/887,615

(22) Filed: Sep. 22, 2010

(65) Prior Publication Data

US 2011/0010117 A1 Jan. 13, 2011

Related U.S. Application Data

(60) Division of application No. 11/556,489, filed on Nov. 3, 2006, now Pat. No. 7,820,457, which is a continuation-in-part of application No. 11/278,827, filed on Apr. 6, 2006, now Pat. No. 7,268,575.

(51) Int. Cl.
*H01L 29/40* (2006.01)

(52) U.S. Cl. .................... 257/355; 438/17; 257/E29.255

(58) Field of Classification Search .................... 438/15, 438/17; 324/762.01, 762.09; 257/288, 355, 257/357, 411, E29.255
See application file for complete search history.

(56) References Cited

U.S. PATENT DOCUMENTS

| | | | | |
|---|---|---|---|---|
| 6,456,104 | B1 * | 9/2002 | Guarin et al. | 324/750.07 |
| 6,521,469 | B1 | 2/2003 | La Rosa et al. | |
| 6,731,179 | B2 | 5/2004 | Abadeer et al. | |
| 6,815,970 | B2 * | 11/2004 | Rost et al. | 324/762.02 |
| 7,268,575 | B1 | 9/2007 | Chen et al. | |
| 2003/0233624 | A1 * | 12/2003 | Reddy et al. | 716/4 |
| 2004/0073412 | A1 * | 4/2004 | Walker et al. | 703/2 |
| 2005/0278677 | A1 | 12/2005 | Ang et al. | |

OTHER PUBLICATIONS

G. Chen et al., "Dynamic NBTI of PMOS Transistors and ITS Impact on Device Lifetime", at www.ece.nus.edu.sg/stfpage/elelimf/pub(updated-Nov. 20, 2004) 16%20Chen%20DNBTI%20IRPS%202003%20 Jan.pdf on Jan. 2003, 7 pages.

Erhong Li et al., "Plasma-Induced Charge Damage and its Effect on Reliability in 0.115-um Technology", 2003 IEEE, pp. 69-72.

Cadence, "Reliability Simulation in Integrated Circuit Design", Published Dec. 2003, 11 pages.

(Continued)

*Primary Examiner* — Brook Kebede

(74) *Attorney, Agent, or Firm* — Duane Morris LLP; Steven E. Koffs

(57) ABSTRACT

An apparatus comprises a circuit for measuring a gate leakage current of a plurality of transistors. A circuit is provided to apply heat to gates of the plurality of transistors. A circuit is provided to apply a single stress bias voltage to the plurality of transistors for a stress period t. The stress bias voltage is sufficient to cause a 10% degradation in a drive current of the transistor within the stress period t. A processor is provided for estimating a negative bias temperature instability (NBTI) lifetime τ of the transistor based on a relationship between the gate leakage current and one or more of the group consisting of gate voltage, gate length, gate temperature, and gate width of the plurality of transistors. The relationship is determined from data observed while applying the single stress bias voltage.

20 Claims, 12 Drawing Sheets

OTHER PUBLICATIONS

Schroder et al., "Negative bias temperature instability: Road to cross in deep submicron silicon semiconductor manufacturing", 2003 American Institute of Physics, Journal of Applied Physica, vol. 94, No. 1, Applied Physics Reviews—Focused Review, pp. 1-18.
H. Aono et al., "Modeling of NBTI Degradation and Its Impact on Electric Field Dependence of the Lifetime", IEEE 04CH37533, 42nd Annual International Reliability Physica Symposium, Phoenix, 2004, pp. 23-27.
"Thin Gate Oxide Device PMOS HCI Reliability and NBTI Effect Correlation", Sep. 28, 2005 at www.paper.edu.cn/ztlw/download.jsp?file-Agilent C-05.
K. Watanabe et al., "New NBTI Lifetime Prediction Method for Ultra Thin SiO2 Films", May 23, 2005 at http: Ilecsmeetz.peerx-press.org/ms-files/ecsmeetz/2005/05/23 100006000/00/6000-0-art-file-o-1117206973-cnv.pdf, 1 page.
STOL Semiconductor Technology Online, "Fostering Synergy for the Advancement: of Semiconductor Technology", at http://www.semitechonline.com/realiability.html, published Nov. 2004, pp. 1-3.
K. Ohgata et al, Universality of Power-Law Voltage dependence for TDDB Lifetime in Thin Gate Oxide PMSOSFETs, IEEE 05CH37616, 43rd Annual International Reliability Physics Symposium, San Jose, 2005.
G. Chen et al., "Dynamic NBTI of p-MOS Transistors and Its Impact on MOSFET Scaling", IEEE Electron Device Letters, 2002 IEEE, pp. 1-3.
Semiconductor International—Conference Report: Plasma and Plasma-Induced Damage 2 . . . , at http://www.reed-electronics.com/semiconductor/article/CA312641?pubdate=7%2F1%2F2 . . . , Jan. 18, 2006.

* cited by examiner

APPARATUS FOR NBTI PREDICTION

This Application is a division of U.S. application Ser. No. 11/556,489, filed Nov. 3, 2006, entitled, "METHOD OF NBTI PREDICTION," now U.S. Pat. No. 7,820,457, which is a continuation-in-part of U.S. patent application Ser. No. 11/278,827, filed Apr. 6, 2006, now U.S. Pat. No. 7,268,575, each of which is incorporated by reference herein in its entirety.

FIELD OF THE INVENTION

The present invention relates to semiconductor devices generally, and more specifically to predication of Negative Bias Temperature Instability (NBTI) lifetimes in semiconductor devices.

BACKGROUND

Negative Bias Temperature Instability (NBTI) is a device degradation mechanism identified in sub-100 nm MOSFETs. When the gate of a P-MOSFET is negatively biased at an elevated temperature, oxide interface traps are generated due to an interaction of holes in the channel inversion layer with gate oxide. The instability is measured as an increase in the magnitude of the threshold voltage of the device. Higher stress temperatures produce more degradation. The mechanism is known to cause reliability performance degradation for the PFET because of this change in threshold voltage. NBTI also results in degradation of transistor drive current for any given drive voltage. NBTI becomes a serious concern for 90 nm technology and beyond, and its effect increases exponentially with decreasing gate oxide thickness.

The term "NBTI lifetime" refers to the period in which the drive current of a transistor at a given drive voltage decreases by 10% from its original value due to NBTI degradation. A transistor that has decreased current output by 10% can have sufficient impact on circuit timing to cause the circuit to fail to perform its intended function, and is thus at the end of its useful life.

A variety of publications have dealt with characteristics, behavior and physics of the NBTI mechanism, Several models have been developed to predict the NBTI lifetime for a given transistor, or circuit containing one or more transistors. NBTI lifetime prediction may in turn be used as part of the system design process, or as part of a qualification procedure for a lot of semiconductor products.

A known NBTI prediction method includes testing transistors at a plurality of different stress voltages (e.g., four different stress voltages) at elevated temperature for a given stress period (e.g., one day at each stress voltage). The transistor drive current at each voltage is monitored throughout the testing. The stress period is long enough so that the drive current of the transistor subjected to the highest stress voltage is reduced by 10%. The transistors subjected to lower stress voltages do not reach 10% degradation during the testing (stress) period, so the amount of time for 10% degradation to occur at each of the lower stress voltages is estimated by extrapolation, based on the drive current degradation measured at each respective stress voltage.

FIG. 1 shows an example in which two different stress voltages are used. The NBTI degradation can be characterized by:

$$\Delta Id/Id \sim t^n, \quad (1)$$

where Id is the drive current, t is the length of time the stress voltage is applied, and n is a parameter referred to herein as the degradation slope.

At a stress voltage level of −2.0V, the transistor reaches 10% degradation, and the stress testing period is then ended. During the same stress period, the transistor subjected to −1.4 V does not reach 10% degradation, so the length of time to reach 10% degradation at 1.4 V is estimated by extrapolation. As shown in FIG. 1, the extrapolated estimate of stress time for the −1.4 V stress voltage can differ substantially depending on whether the extrapolation is based on the full range of measured degradation values, or only on the last five points measured.

There has been controversy regarding these models and the selection of data points to be used in the models. For example, consider a first sample including the full range of drive current data points collected throughout the stress period at one of the lower voltages, such that drive current degradation during the stress period is less than 10%. Also consider a second sample including only a subset of the same data in the first sample (e.g., the five most recently collected drive current data points at the end of the stress period). Using a conventional NBTI model, the predicted NBTI based on the first sample may differ from the predicted NBTI based on the second sample (because of the extrapolation used to determine the stress time for the lower voltage levels). For example, the predicted NBTI based on the full range of data from the first sample may be substantially shorter than the predicted NBTI based on the subset of data in the second sample.

FIG. 2 shows an example of NBTI predictions based on stress testing at four different stress voltages: −1.1, −1.55, −1.7 and −1.85 Volts. The line indicated by ellipses is based on the stress time extrapolated based on the full range of test data. The line indicated by squares is based on the stress time extrapolated based on the last five test data. The results based on the full data range at each stress voltage predict a shorter NBTI lifetime than the results based on the last five data points at each stress voltage.

Neither the extrapolation based on the full range of sample selection or the extrapolation based on the last-five-points has achieved universal acceptance.

A model that underestimates the NBTI lifetime is troublesome, because it causes over-design of circuits and increases the cost of products that are required to last for a given specified product life.

SUMMARY OF THE INVENTION

In some embodiments, a method includes measuring a gate leakage current of a plurality of transistors. A single stress bias voltage is applied to the plurality of transistors. The stress bias voltage causes a 10% degradation in a drive current of each transistor within a respective stress period t. One or more relationships are determined, between the measured gate leakage current and one or more of the group consisting of gate voltage, gate length, gate temperature, and gate width of the plurality of transistors, respectively. A negative bias temperature instability (NBTI) lifetime $\tau$ of the plurality of transistors is estimated, based on the measured gate leakage current and the one or more relationships.

In some embodiments, a method includes measuring a gate leakage current of a plurality of transistors. A single stress bias voltage is applied to the plurality of transistors. The stress bias voltage causes a 10% degradation in a drive current of each transistor within a respective stress period t. One or more ratios are determined, relating a logarithm of the measured gate leakage current to one or more of the group consisting of gate voltage, gate length, gate temperature, and gate width of the plurality of transistors, respectively. A negative bias temperature instability (NBTI) lifetime τ of the plurality of transistors is estimated based on the measured gate leakage current, and a relationship between drive current degradation and time observed during the applying step, and the one or more ratios.

In some embodiments, an apparatus comprises a circuit for measuring a gate leakage current of a plurality of transistors. A circuit is provided to apply heat to gates of the plurality of transistors. A circuit is provided to apply a single stress bias voltage to the plurality of transistors for a stress period t. The stress bias voltage is sufficient to cause a 10% degradation in a drive current of the transistor within the stress period t. A processor is provided for estimating a negative bias temperature instability (NBTI) lifetime τ of the transistor based on a relationship between the gate leakage current and one or more of the group consisting of gate voltage, gate length, gate temperature, and gate width of the plurality of transistors. The relationship is determined from data observed while applying the single stress bias voltage.

FIG, 11A is a diagram of a determination of the relationship between leakage current and gate width.

Figure 11A:
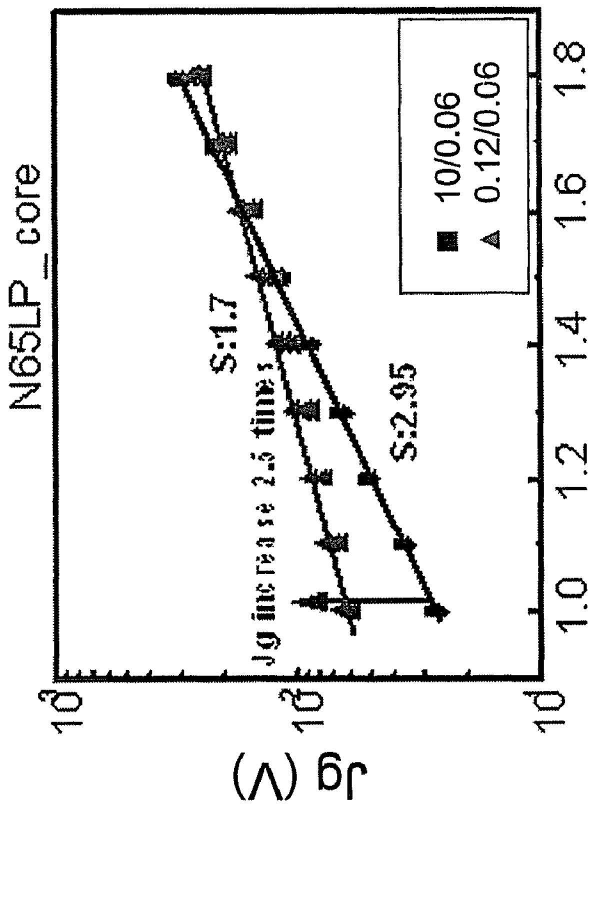
Figure 11B:
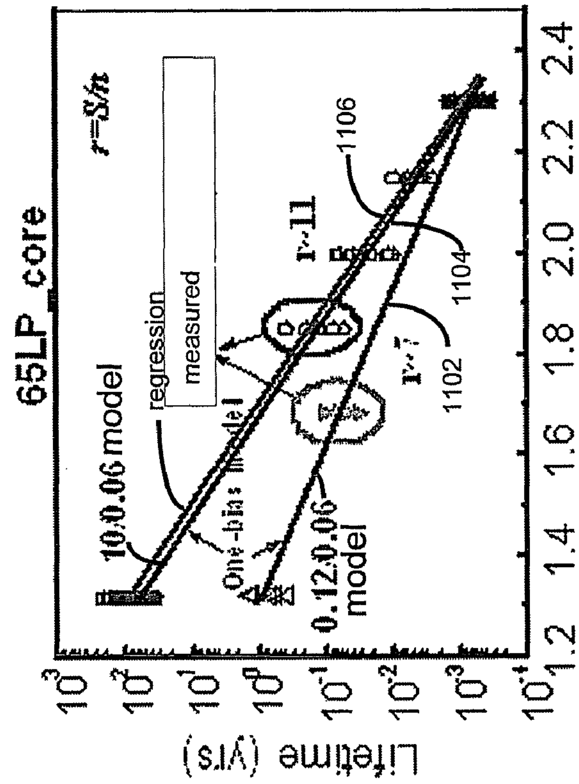

FIG. 11B is a diagram of NBTI prediction based on the relationship of FIG. 11A.

DETAILED DESCRIPTION

This description of the exemplary embodiments is intended to be read in connection with the accompanying drawings, which are to be considered part of the entire written description.

The literature has reported that NBTI degradation and gate leakage current mechanisms both are related to hole trapping, and that NBTI degradation in ultra thin oxide layers (as quantified by the fractional change in drive current) is proportional to the initial gate leakage current of the transistor. That is:

$$\Delta Id/Id \sim Jg, \quad (2)$$

where ΔId/Id is the fractional change in drive current for a given drive voltage, and Jg is the gate leakage current.

Figure 3:
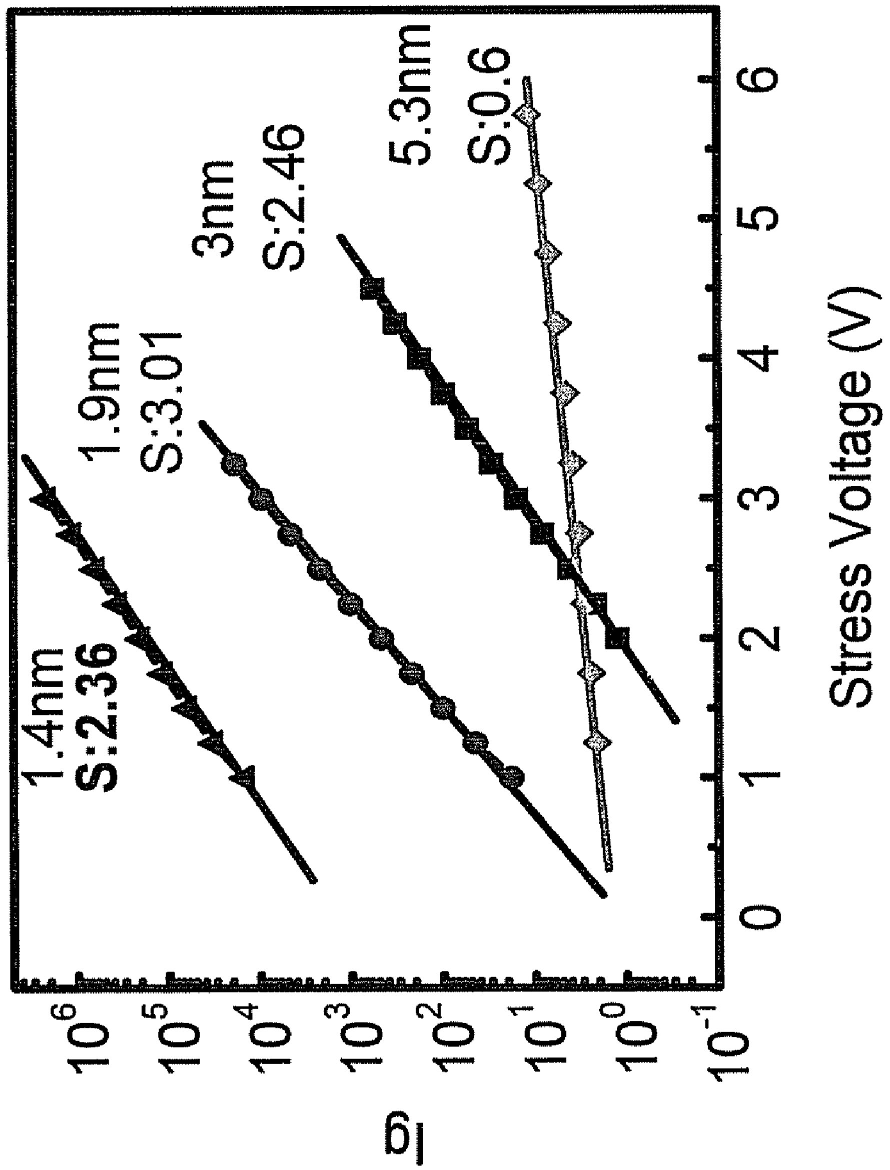
FIG. 3 is a diagram showing measurements of gate leakage current as a function of gate voltage for a plurality of gate geometries.

The inventors of the present application have developed an NBTI prediction method based on equation (2). Gate leakage current can be plotted against gate voltage for a variety of gate oxide thicknesses, as shown in FIG. 3. When the natural logarithm of gate leakage current for a given transistor is plotted against the voltage Vg between the gate electrode of that transistor and ground, the result is a substantially straight line having a slope s. Thus, $$Ig \sim \exp(sVg) \quad (3)$$

where Ig is the leakage current, Vg is the voltage between the gate and ground, and s is the slope of the Ig-Vg curve. The slope s varies with the gate oxide thickness.

NBTI can now be modeled by:

$$\Delta Id/Id \sim t^n \exp(sVg)\exp(Ea/KT) \quad (4)$$

where Ea=activation energy, K=Boltzmann's constant, (1.38×10−23 J/K), T=absolute temperature (the temperature of the gate oxide during operation) in Kelvin, and n is the degradation slope.

By definition, the NBTI lifetime is the length of time for ΔId/Id to reach a value of 0.1. Inserting this value into equation (4) yields:

$$0.1 \sim \tau^n \exp(sVg)\exp(Ea/KT), \quad (5)$$

where τ is the NBTI lifetime, and Vg and T are the gate voltage and gate absolute temperature, respectively, during operation. Taking the natural logarithm of both sides yields:

$$ln(0.1)=n*ln(\tau)+sVg+Ea/Kt \quad (6)$$

Solving for ln(τ) yields:

$$\ln(\tau) \sim \ln 0.1/n - Ea/KTn - rVg, \quad (7)$$

where the ratio r=s/n.

Equation (7) suggests that the relationship between the natural logarithm of the NBTI lifetime and the stress voltage can be modeled with a linear plot.

Figure 1:
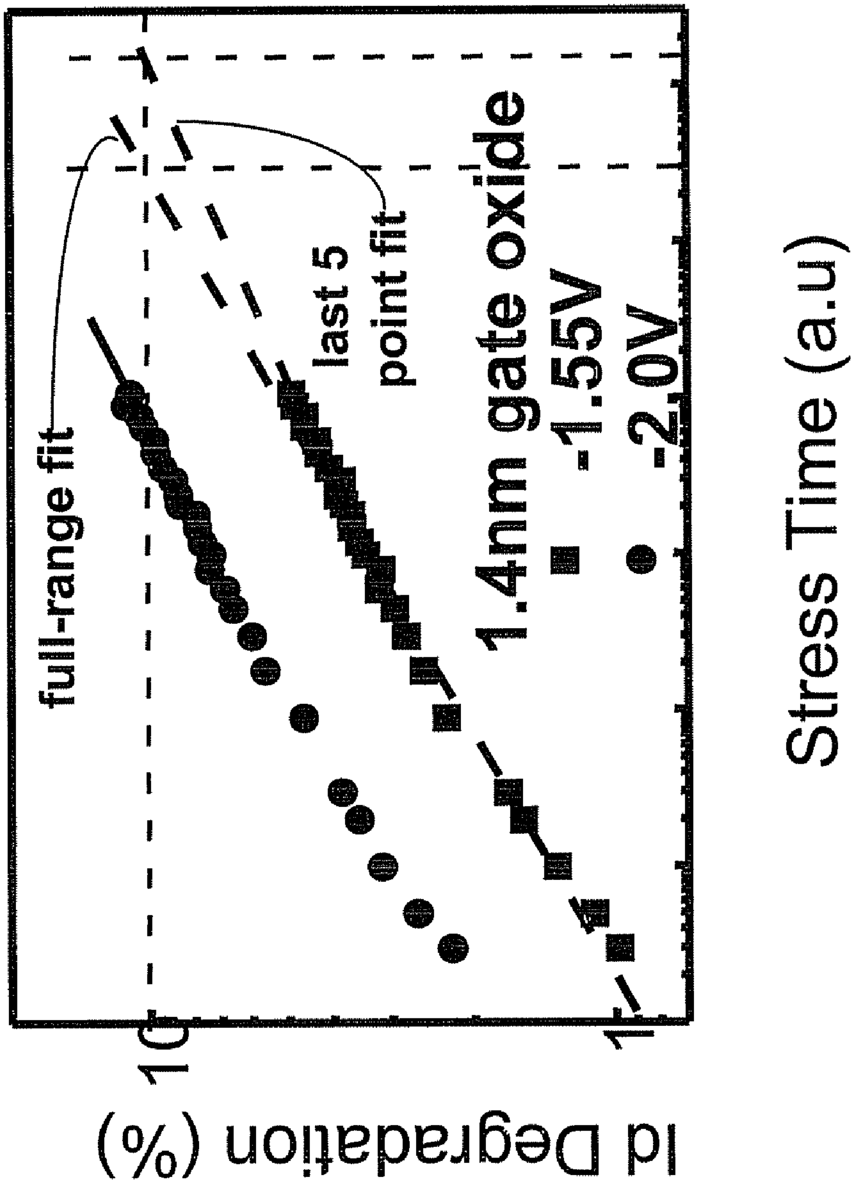
FIG. 1 is a diagram showing conventional accelerated measurement of drive current degradation over time for a plurality of stress voltages.
Figure 2:
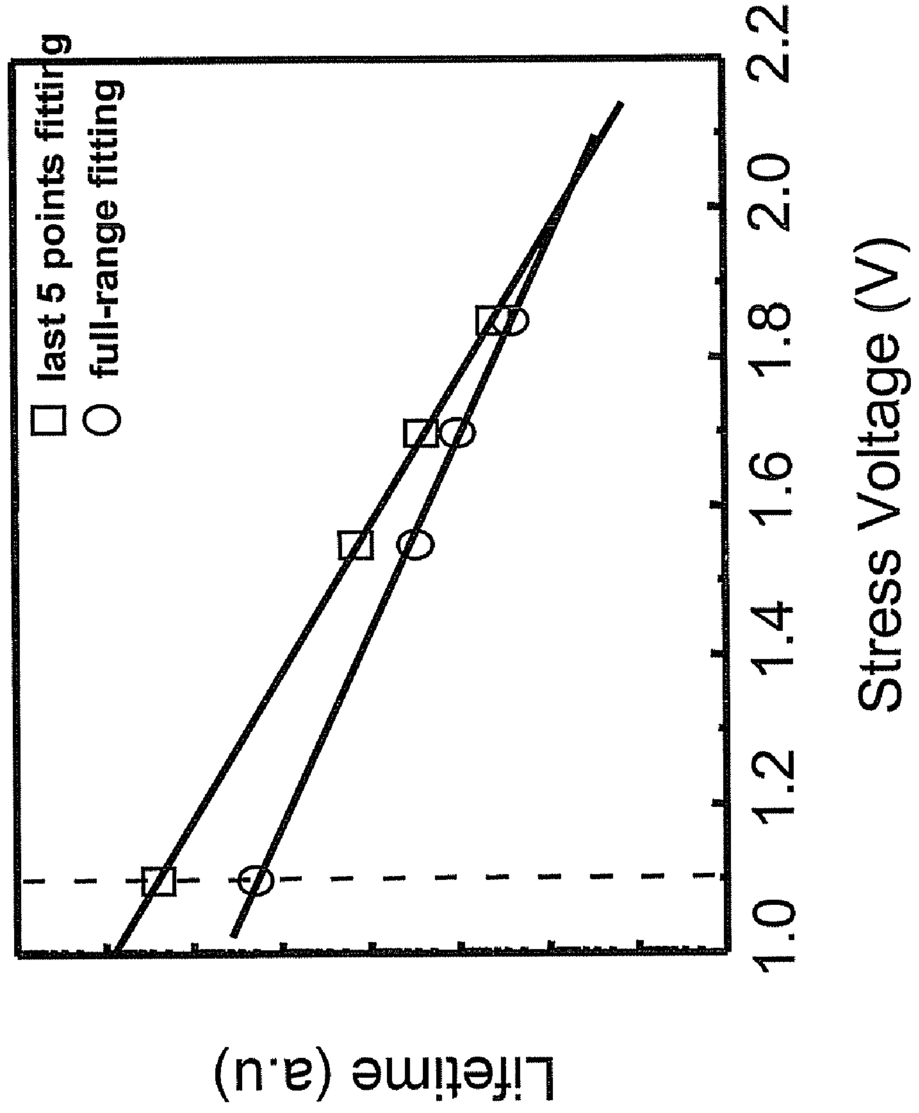
FIG. 2 is a diagram showing conventional estimation of NBTI lifetime based on accelerated measurements collected at four stress voltages, using two extrapolation methods.
Figure 4A:
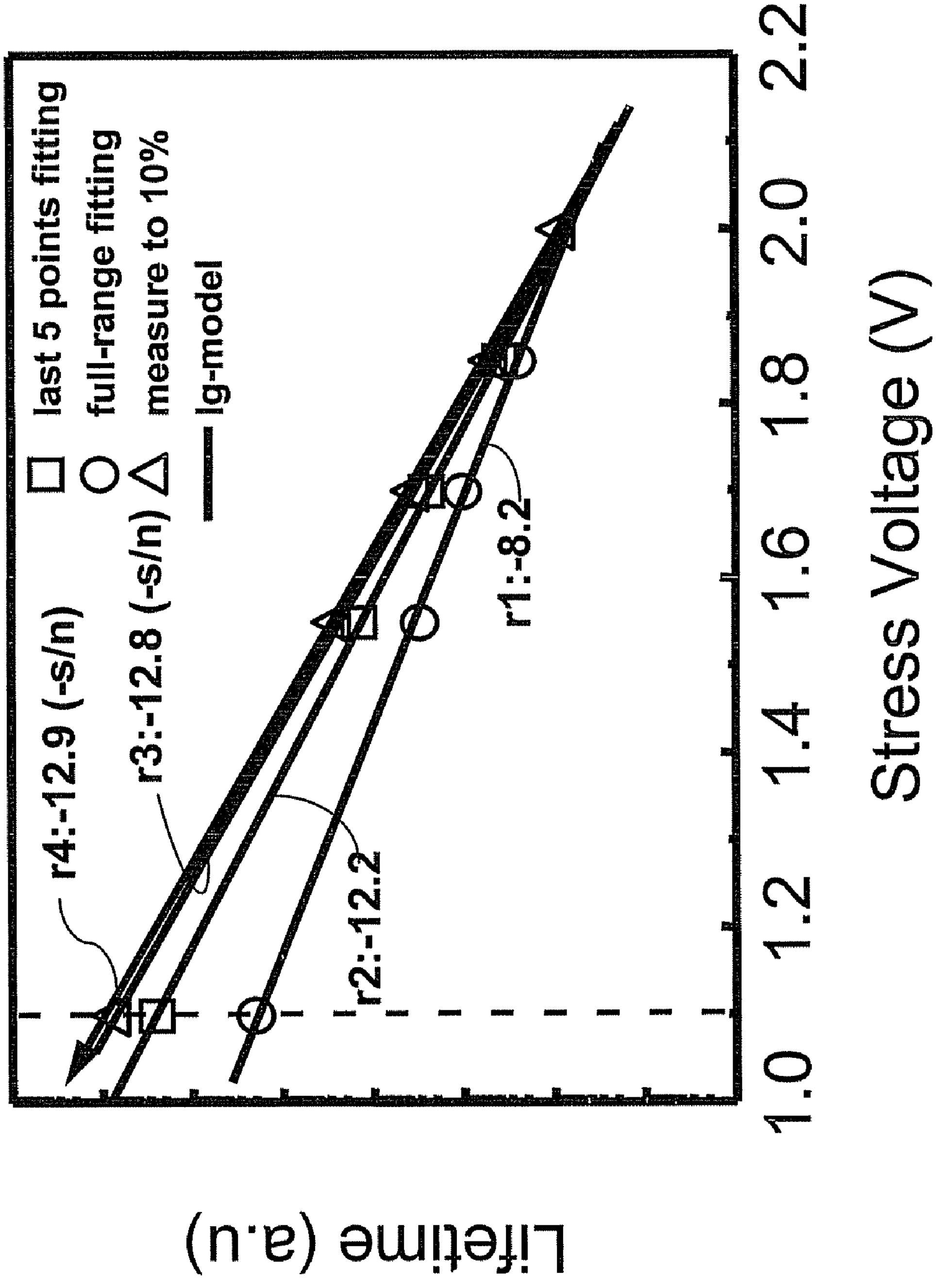
FIG. 4A is a diagram showing estimation of NBTI lifetime based on accelerated measurements collected at a single stress voltage, using two extrapolation methods.

FIG. 4A is a diagram showing how the Ig model of equation (7) can be applied. In FIG. 4A, the regression lines from FIG. 2 are again presented (labeled r1 and r2), along with additional lines labeled r3 and r4. Line r3 represents an NBTI lifetime prediction based on drive current data measured at five stress voltage levels −1.1, −1.55, −1.7, −1.85 and 2.0 Volts) for a transistor lot (e.g., a qualification lot). The line r3 represents transistors measured to real failure criteria (NBTI degradation of 10%) by −1.55, −1.7V −1.85V and −2.0V. The lines r1/r2 are produced using a different fitting methodology than lines r3/r4, but they are measured from different devices within the same lot. When the initial gate leakage current is mapped against the gate voltage, the ratio r for this transistor lot is calculated to be r=s/n=−12.8.

The line r4 represents the NBTI lifetime calculated using the Ig model of equation (7) and a ratio r=−12.9 based on the measured data collected at a single stress voltage, in this case the highest of the stress voltages used to provide the data for line r3. The stress voltage used to collect data for applying equation (7) to generating line r4 is sufficient to cause NBTI degradation of 10% in the transistors being measured during the stress test. Thus, comparing lines r3 and r4, line r3 is based on data collected at five different stress voltages, and line r4 is based on data collected at only one of the five stress voltages used to collect the data used to make line r3.

In this example, line r4 is based on the stress voltage 2.0 Volts, The lines r3 and r4 show that the Ig model of equation (7) provides results (line r4) consistent with empirical data (line r3). Testing over 5 lots at the 65 nanometer node demonstrated that the Ig model described herein provides results consistent with the conventional E-model (4-bias level testing), as shown in FIG. 4B.

Figure 4B:
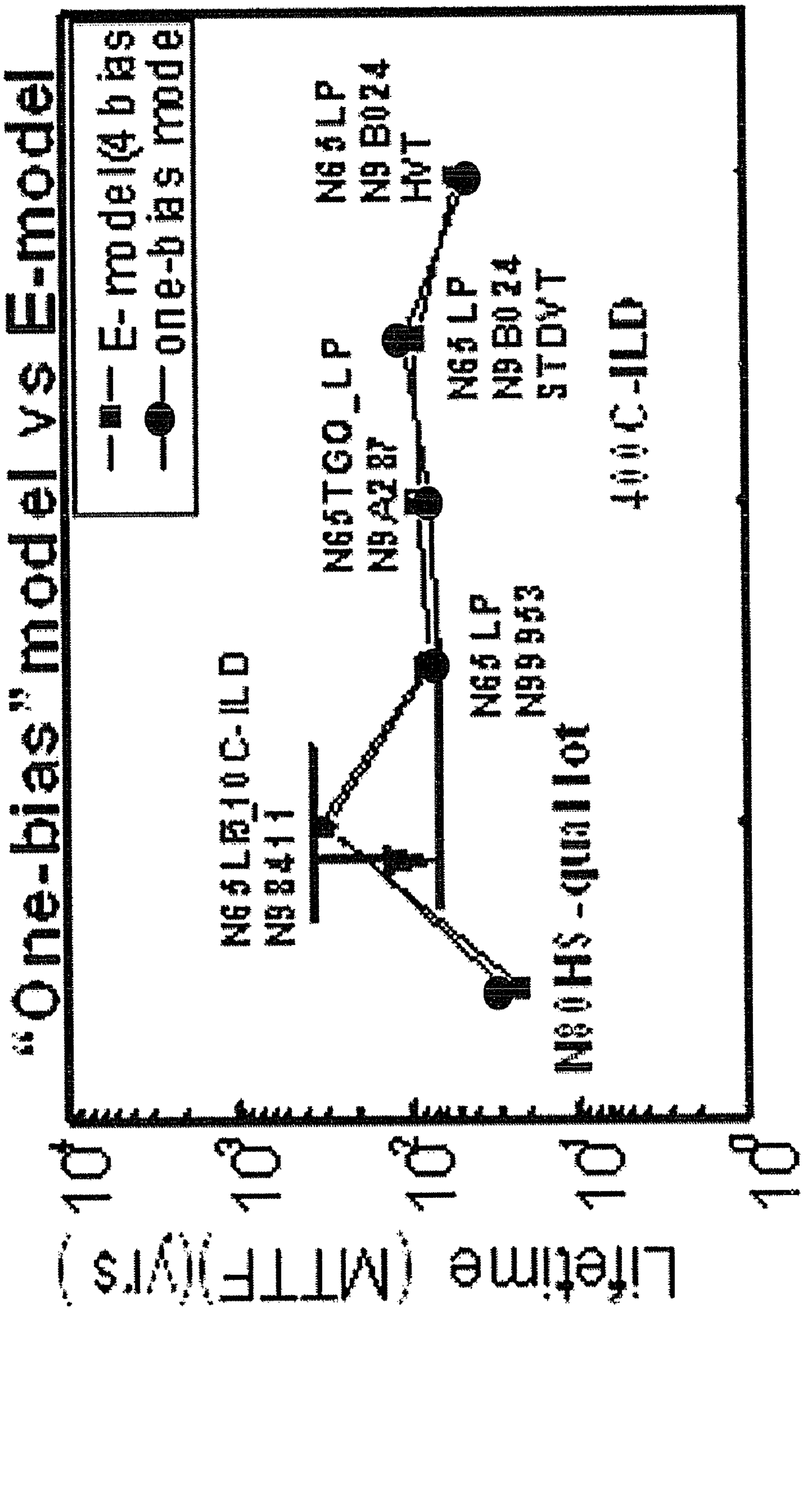
FIG. 4B is a diagram comparing NBTI data for five lots calculated by an exemplary method with respective NBTI data calculated using a conventional model.

FIG. 4B is a diagram comparing NBTI data (shown by circles) for five lots of devices calculated by an exemplary method with respective NBTI data (shown by squares) calculated using a conventional E-model (4-bias level testing). Although each curve contains six points, the two right-most points in each curve both belong to respectively different devices in the same lot. The exemplary method shows good correspondence with the E-model.

Because the stress voltage used for the Ig model of equation (7) is sufficiently high to cause a 10% degradation in a drive current of the transistor at the given temperature within the period of the test (stress period t), no extrapolation is involved in determining the time to reach 10% NBTI degradation at that voltage. The 10% degradation is actually achieved during the test.

Figure 5:
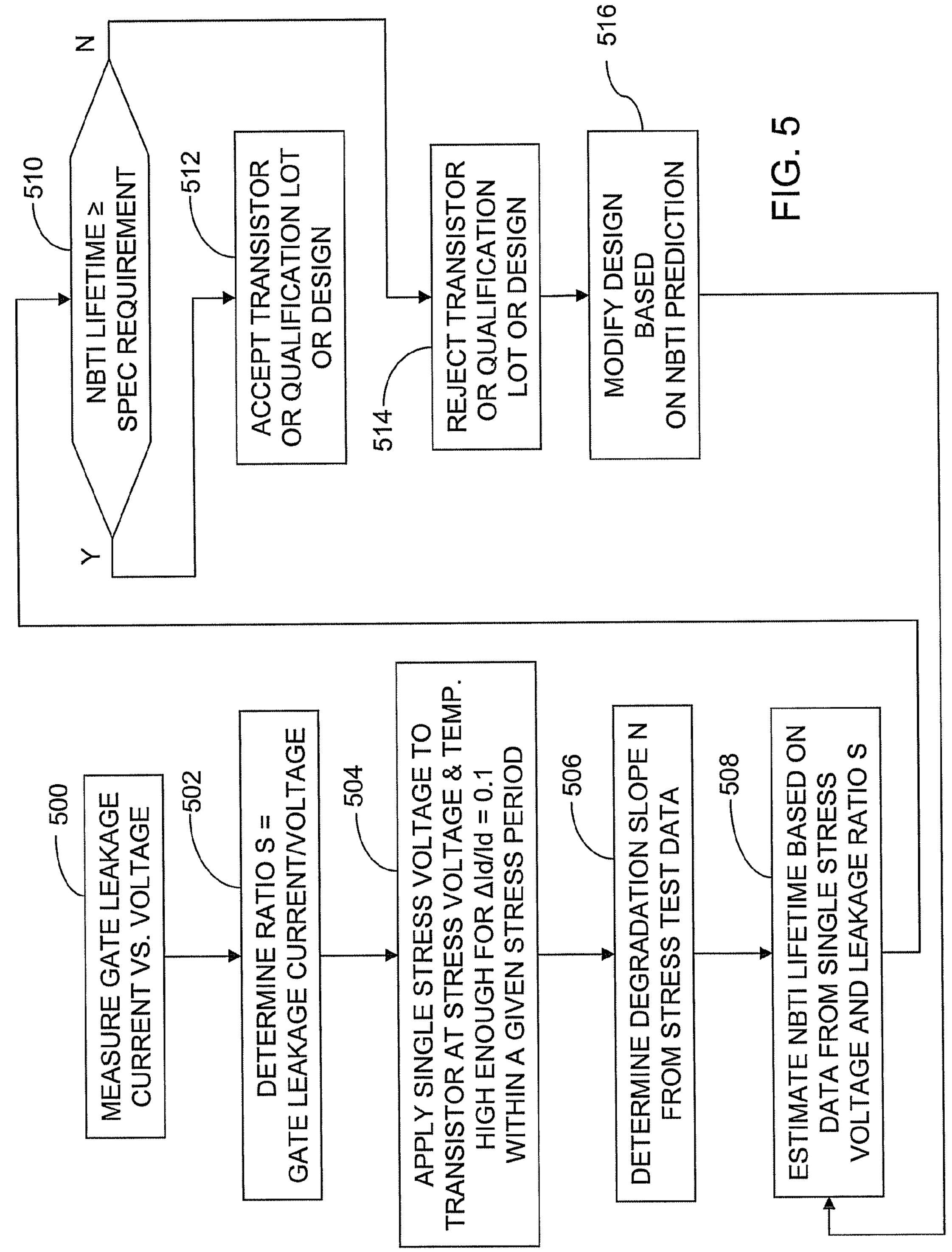
FIG. 5 is a flow chart diagram of an exemplary method for predicting NBTI lifetime.

FIG. 5 is a flow chart of an exemplary method.

At step 500, the gate leakage current is measured before the step of applying a single stress bias voltage.

At step 502, a gate leakage current of at least one transistor is divided by a corresponding gate voltage of the transistor to determine a ratio s thereof.

At step 504, a single stress bias voltage is applied to the at least one transistor at a given temperature for a stress period t. The stress bias voltage is sufficiently high to cause a 10% degradation in a drive current of the transistor at the given temperature within the stress period t. In some embodiments, the stress bias period is about 24 hours or less. One of ordinary skill understands that the stress temperature, stress bias voltage and stress period are related, so an appropriate combination of bias voltage and temperature can be selected to complete the stress period (i.e., reach 10% drive current degradation) within a reasonable test period range (e.g., one day, 2 days, one week, or whatever range of time period the engineer wants to select).

The at least one transistor may be a single transistor, a circuit (e.g., a ring oscillator circuit) comprising one or more transistors and additional circuit elements, or a sample from a qualification lot containing a plurality of transistors or circuits.

At step 506, a degradation slope n is determined, such that a change in the drive current of the transistor due to application of the single stress bias voltage is proportional to $t^n$. This determination may be made automatically by a processor, or graphically by plotting the measurements of the stress testing.

At step 508, a negative bias temperature instability (NBTI) lifetime $\tau$ of the transistor is estimated as a function of the ratio s of the gate leakage current to the gate voltage, and the degradation slope n determined from application of the single stress bias voltage. This estimate may be made using equation (7), for example.

At step 510, the estimated NBTI lifetime is compared to the NBTI lifetime required by the relevant specification for the transistor. If the specification requirement is met, step 512 is executed. If not, then step 514 is executed.

At step 512 the transistor or design or circuit or qualification lot of a product that includes the at least one transistor is accepted, if the calculated NBTI lifetime $\tau$ for the at least one transistor is greater than or equal to a threshold value.

At step 514 the transistor or design or circuit or qualification lot of a product that includes the at least one transistor is rejected, if the calculated NBTI lifetime $\tau$ is less than the threshold value.

At step 516 a transistor circuit design may optionally be modified based on the estimated NBTI lifetime. For example, the gate dielectric thickness may be adjusted to improve the NBTI lifetime, or a change may be made to the circuit design to reduce the operating temperature of the gate dielectric layer. Alternatively, gate length or width may be adjusted.

After the design adjustment is made, steps 508-516 may optionally be re-executed to determine whether the NBTI lifetime of the modified design is acceptable.

In the examples described above, a particular equation is used for estimating NBTI based on testing at a single stress bias voltage without extrapolation of the length of the stress period. One of ordinary skill can apply this method to other models based on other equations, in which test results from a single stress bias voltage (that causes a specified percentage degradation in drive current during the test) are used without extrapolating the length of the stress period.

Figure 6:
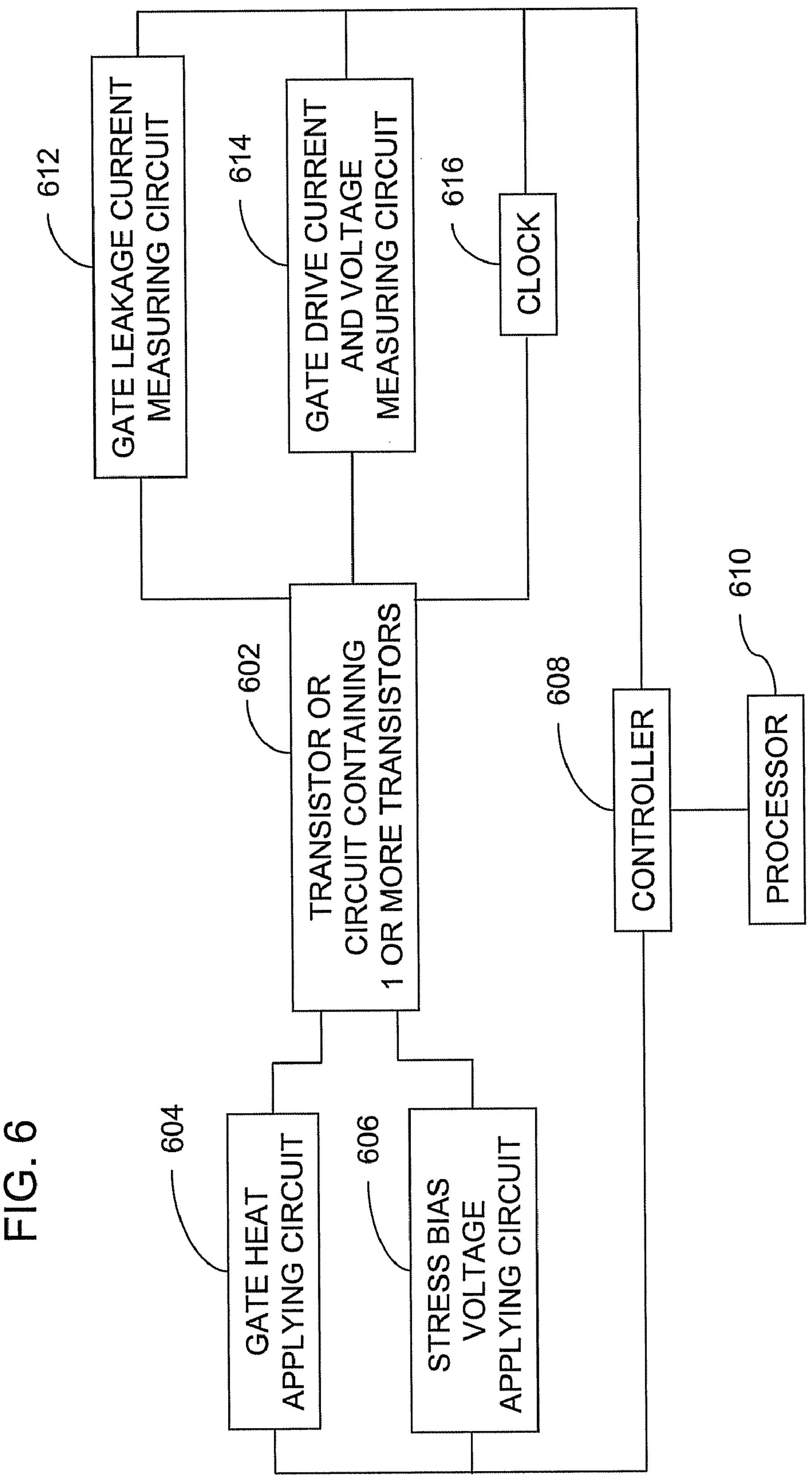
FIG. 6 is a block diagram of an exemplary apparatus for predicting NBTI lifetime.

FIG. 6 is a block diagram of an exemplary configuration for predicting the NBTI lifetime of a transistor or circuit 602.

A gate heat applying circuit 604 is connected to the gate electrode, to apply heat to the electrode of the transistor, or of the transistors if a circuit containing more than one transistor is tested. The circuit 604 may receive a temperature feedback signal from a temperature sensor (e.g., a thermocouple) near the gate of the transistor(s).

A stress bias voltage applying circuit 606 is connected to the gate electrode, to bias the gate.

A gate leakage current measuring circuit 612 is connected to measure the leakage current from the gate electrode to ground in response to a gate voltage.

A gate drive current and voltage measuring circuit measures the current flowing from drain to source in response to a drive voltage.

A clock 616 measures the length of time that elapses during the stress voltage testing. The clock 616 may be a component of the processor 610.

A controller 608 commands the circuits 604, 606, 612, 614 to perform the stress bias testing and to collect the data from the transistor(s)/circuit under test.

The processor 610 provides a user interface for the technician or engineer operating the system. The processor also performs computations, such as the NBTI lifetime calculation. The processor may be a desktop or laptop computer, for example.

One of ordinary skill in the art can readily select or design the components of FIG. 6. For example, circuits described in U.S. Pat. Nos. 6,456,104 or 6,731,179 may be used to provide heat and bias voltage, and measure the degradation in drive current. These patents are incorporated by reference as though set forth fully herein.

Figure 7:
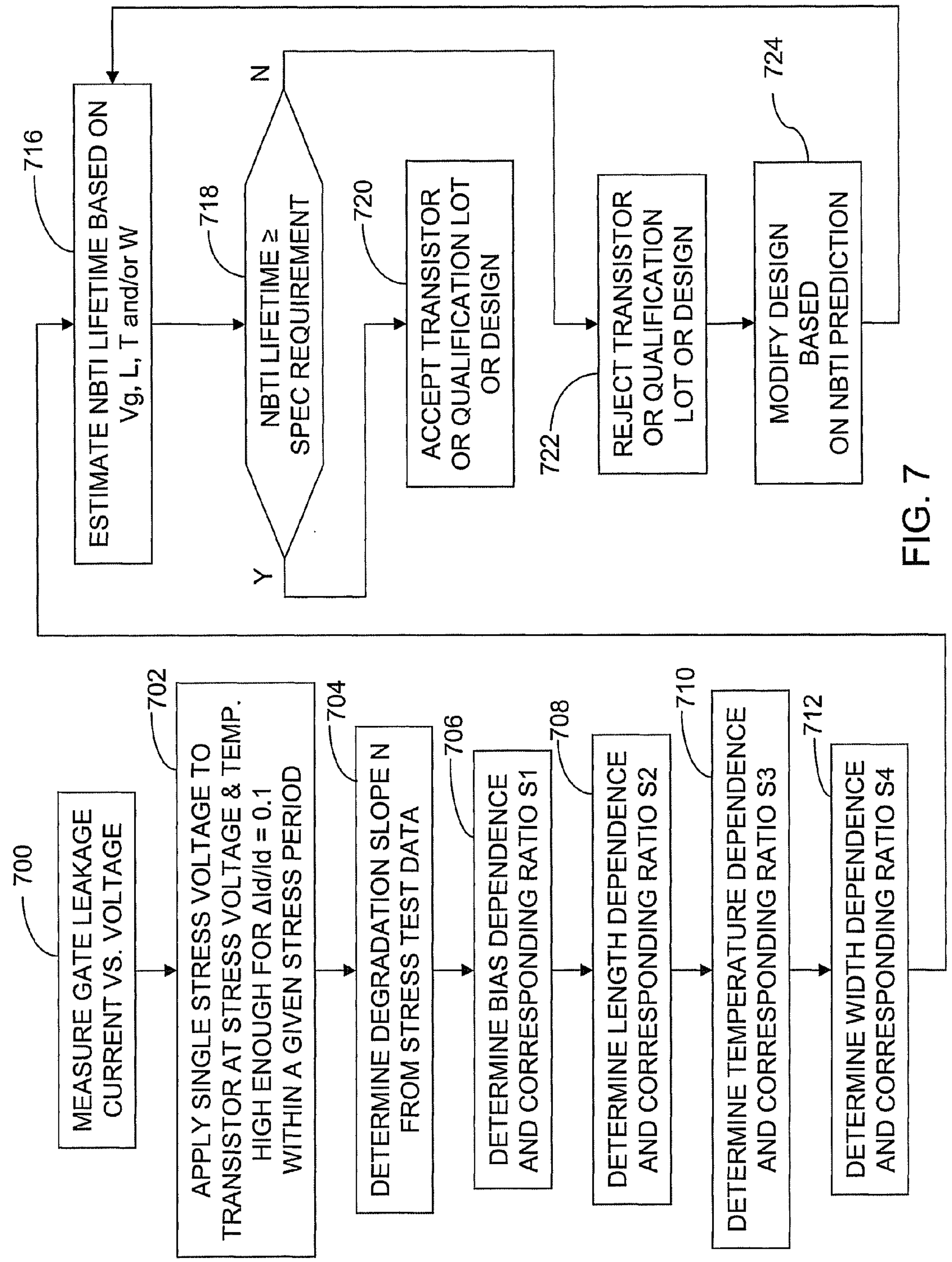
FIG. 7 is a flow chart of an exemplary method according to an embodiment of the invention.

FIG. 7 is a flow chart of an exemplary embodiment in which a plurality of devices are tested at a single stress bias voltage sufficient to cause 10% NBTI degradation, to determine the dependence of NBTI on one or more of a plurality of factors. The exemplary method of FIG. 7 may be performed using the apparatus described above, with reference to FIG. 6.

In the embodiment of FIGS. 4A-6, the gate leakage is used in combination with test data corresponding to a stress bias voltage sufficient to cause actual NBTI failure. In the example of FIGS. 7-11, additional factors that influence NBTI are taken into consideration in combination with test data corresponding to a stress bias voltage sufficient to cause actual NBTI failure. In FIG. 7, these other factors include absolute temperature, gate length, and gate width. One or more relationships are determined between the measured gate leakage current and one or more of the group consisting of gate voltage, gate length, gate temperature, and gate width of the plurality of transistors, respectively; These other factors may be considered either one at a time, or in various combinations with one another. These factors are exemplary in nature, and other factors which may be determined to substantially affect NBTI for any given technology may be investigated using analogous techniques which preferably include testing at a single stress bias voltage sufficient to cause 10% NBTI degradation during testing.

At step 700 a gate leakage current of a plurality of transistors is measured.

At step 702, a single stress bias voltage is applied to the plurality of transistors. The stress bias voltage is sufficient to cause a 10% degradation in the drive current of each transistor within a respective stress period t. Because the stress bias voltage is sufficient to cause 10% NBTI degradation, the applying step measures the stress period t without extrapolating the stress period t.

In some embodiments, four different values are varied during step 702: the stress voltage, the gate length, the absolute temperature (of the gate), and the gate width. Data are collected to allow evaluation of the effects of each of these variables on NBTI lifetime. In other embodiments, one, two or three of these four variables are varied during step 702.

At step 704, a degradation slope n is determined, such that a change in the drive current of the transistor due to application of the single stress bias voltage is proportional to $t^n$. For example, in a log-log plot of NBTI degradation (ΔI/I) versus time, the slope of the resulting line is n. This determination can be automated by finding the slope of a regression line of ln(ΔI/I) versus ln(time).

Figure 8A:
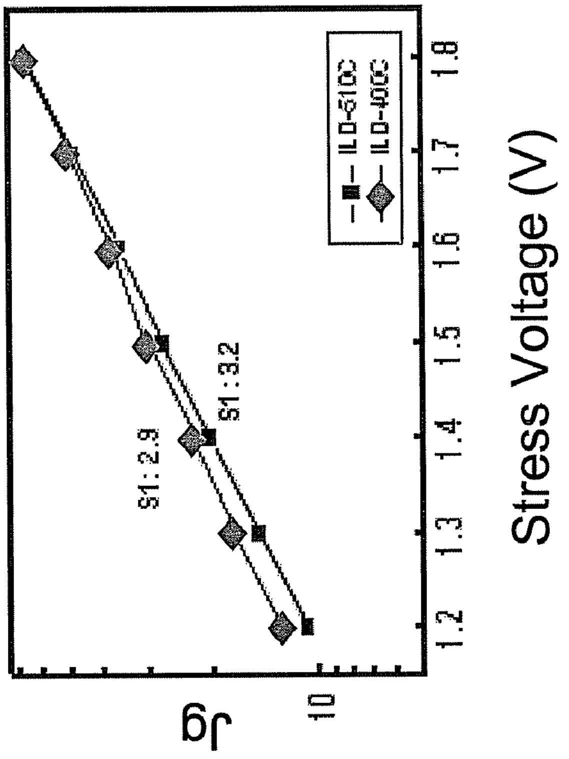
FIG. 8A is a diagram of a determination of the relationship between leakage current and bias voltage.
Figure 8B:
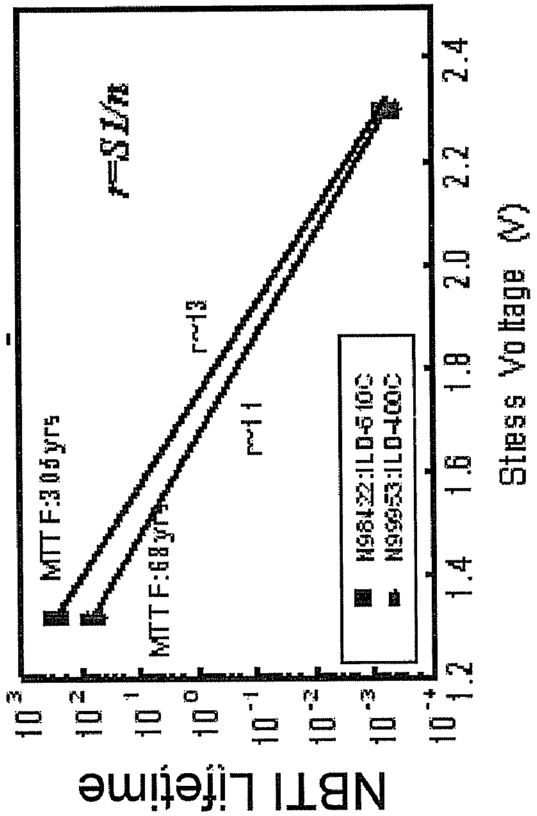
FIG. 8B is a diagram of NBTI prediction based on the relationship of FIG. 8A.

At step 706, the NTBI dependence on bias voltage and the corresponding ratio S1is determined based on the ratio s and the degradation slope n. FIG. 8A shows the determination of the ratio S1, as the slope of a semi-log plot of the leakage current Jg versus stress voltage. As shown by the linear relationship in FIG. 8A, S1 is proportional to ln(Jg)/Vg. The slope S1 can be determined graphically. The value S1 can also be determined automatically by a processor as the slope of a regression line of ln(Jg)/Vg. FIG. 8B shows the NBTI lifetime plotted against the stress voltage for two values of r, where r=S1/n. In FIG. 8B, the NBTI lifetime is determined by:

$$\ln(T) \sim (\ln 0.1)/n - Ea/(KTn) - rVg \tag{8}$$

This is similar to the calculation described above with reference to FIG. 4A.

At step 708 of FIG. 7, the NTBI dependence on gate length (L) and the corresponding ratio S2 is determined from measured gate lengths of the plurality of transistors and the degradation slope n.

Figure 9A:
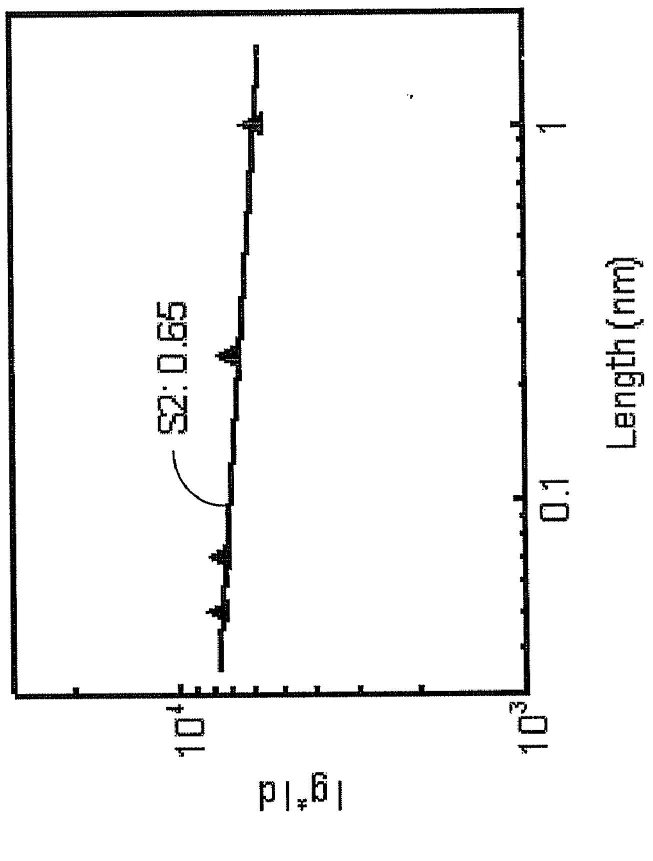
FIG. 9A is a diagram of a determination of the relationship between leakage current and gate length.
Figure 9B:
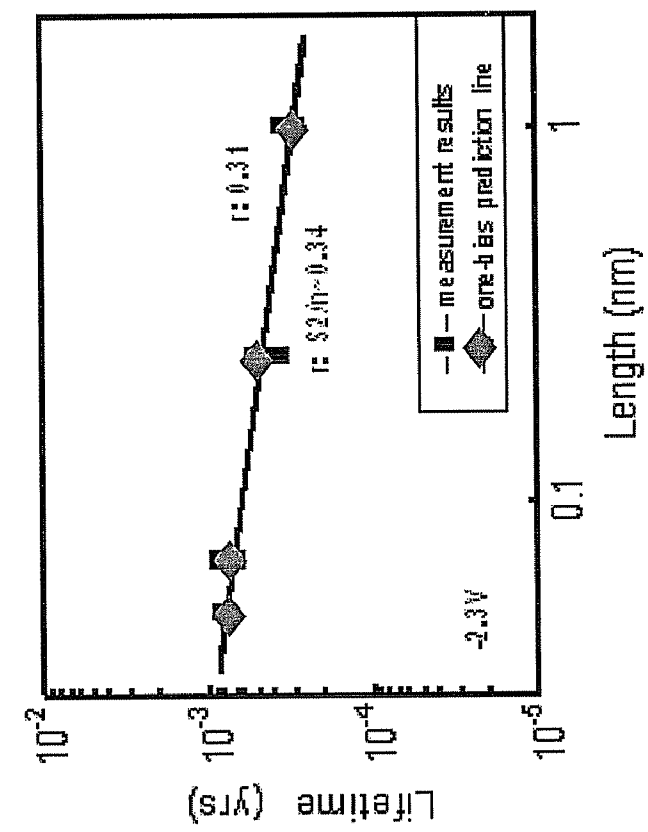
FIG. 9B is a diagram of NBTI prediction based on the relationship of FIG. 9A.

FIG. 9A shows the determination of the ratio S2, as the slope of a log-log plot of the leakage current—drive current product (Ig*Id) versus gate length (where Ig*Id is proportional to the leakage current Jg). As shown by the linear relationship in FIG. 9A, S2 is proportional to ln(Ig*Id)/ln(L). FIG. 9B is a log-log plot showing the NBTI lifetime plotted against the Length L. In FIG. 9B, the NBTI lifetime is determined by:

$$\ln(\tau) \sim \ln 0.1/n - (S2/n)\ln(L) \tag{9}$$

FIG. 9B shows that the model results (diamonds) are closely correlated with the measurement results (squares).

Although FIG. 9A shows Ig*Id plotted along the vertical axis, Ig*Id is proportional to the leakage current. Therefore, the slope S2 and the relationship of equation (9) also relate ln(Jg) to ln(L).

At step 710 of FIG. 7, the NTBI dependence on the absolute temperature of the gate and the corresponding ratio S3 is determined. The activation energy (Ea) of an NBTI failure is determined based on the slope of the line relating the measured a ratio of In (Jg) to (n/KT) observed during step (c), where Jg is the gate leakage current, and T is the absolute temperature, K is Boltzman's constant, and n is a degradation slope n, such that a change in the drive current of the transistor due to application of the single stress bias voltage is proportional to $t^n$.

Figure 10B:
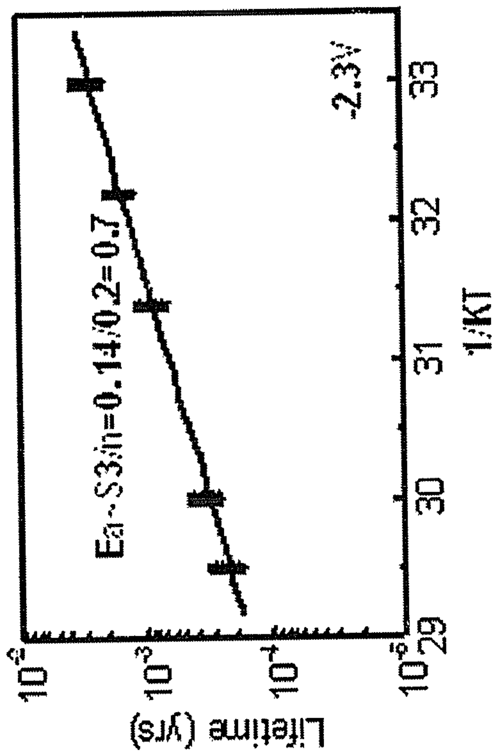
FIG. 10B is a diagram of NBTI prediction based on the relationship of FIG. 10A.
Figure 10A:
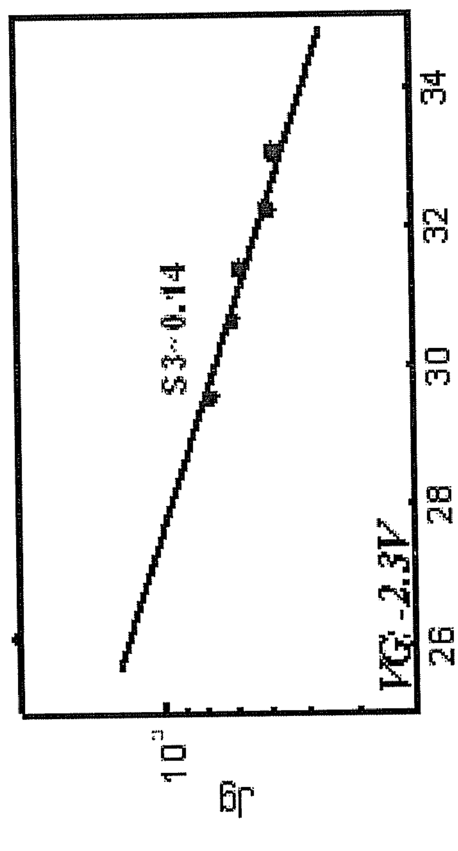
FIG. 10A is a diagram of a determination of the relationship between leakage current and absolute temperature.

FIG. 10A shows the determination of the ratio S3, as the slope of a semi-log plot of the leakage current Jg versus (1/KT). As shown by the linear relationship in FIG. 10A, S3 is proportional to ln(Jg)/(1/KT). The value S3 may be determined automatically by a processor as the slope of a regression line of ln(Jg)/(1KT). FIG. 10B shows the NBTI lifetime plotted against (1/KT). In FIG. 10B, the NBTI lifetime is determined by:

$$\ln(T) \sim (\ln 0.1)/n - Ea/(KT) \tag{10}$$

where the activation energy in this case is given by Ea=S3/n.

At step 712 of FIG. 7, the NTBI dependence on gate width (W) and the corresponding ratio S4 is determined. The width W is generally a more important factor for small devices (having a gate width less than 1 μm and a gate length of less than 0.1 μm. FIG. 11A shows the determination of the ratio S4, as the slope of a semi-log plot of the leakage current Jg versus gate voltage for two different gate widths. In FIG. 11A, the squares represent data for a device having a gate 10 μm wide by 0.06 μm long, and the triangles represent data for a small device having a gate 0.12 μm wide by 0.06 μm long. The slope S4 is about 1.7 for the small (0.12×0.06) device, and about 2.95 for the 10×0.06 device. However, the leakage current Jg for the small device is substantially higher at low gate voltages. The leakage current for the larger devices becomes larger when the bias voltage reaches about 1.6 Volts. FIG. 11B is a semi-log plot showing the NBTI lifetime plotted against the stress voltage. In FIG, 11B, the NBTI lifetime is determined by equation (8), except that for FIG. 11B, the value r=S4/n. In FIG. 11B, curve 1102 is the one-bias model prediction for a 0.12×0.06 device; curve 1104 is the one-bias model for the 10×0.06 device; and curve 1106 is a regression line from the measured data points for the 10×0.06 device, FIG. 11B shows that the measured data points are for the 10×0.06 device are closely correlated with the one-bias model for the 10×0.06 device.

Respective relationships between the measured gate leakage current and the gate voltage for at least two sets of transistors having respectively different gate widths. The NBTI lifetime τ of a lot of transistors can then be estimated based on the measured gate leakage current, a gate width of the lot of transistors, and the determined relationship for the gate width corresponding to the gate width of the lot of transistors.

In the example above, for 65 nm technology, the inventor has determined that the width effect on NBTI lifetime can be estimated by dividing the transistors into at least two sets of transistors having respectively different gate widths, where one of the sets of transistors has a gate width greater than about 10 μm or a gate length greater than about 0.1 μm, and the other of the sets of transistors has a gate width of about 10

μm or less and a gate length of about 0.1 μm or less. For other technologies, (e.g., 45 nm and beyond), the width effect can be determined by dividing the transistors into two respective groups, where the dividing line between "small devices" and other devices is a different size, depending on the particular technology being used.

At step 716 of FIG. 7, the NBTI lifetime is estimated, based on the determined relationship(s) between the gate leakage current and one or more of the bias voltage Vg, the gate length L, the absolute temperature T of the gate, and/or the gate width. Based on the data collected during the single bias stress testing of step 702, and the pertinent characteristics (bias voltage, length, operating temperature and gate width) of the device type for which NBTI lifetime is being determined, one of ordinary skill can determine which of the four factors the NBTI lifetime of the particular device type is most sensitive to. The corresponding equation (8), (9), or (10) is then applied.

At step 718, the estimated NBTI lifetime is compared to the NBTI lifetime required by the relevant specification for the transistor. If the specification requirement is met, step 720 is executed. If not, then step 722 is executed.

At step 720 the transistor or design or circuit or qualification lot of a product that includes the at least one transistor is accepted, if the calculated NBTI lifetime τ for the at least one transistor is greater than or equal to a threshold value.

At step 722 the transistor or design or circuit or qualification lot of a product that includes the at least one transistor is rejected, if the calculated NBTI lifetime τ is less than the threshold value.

At step 724 a transistor circuit design may optionally be modified based on the estimated NBTI lifetime. For example, the gate length and/or width may be adjusted to improve the NBTI lifetime, or a change may be made to the circuit design to reduce the operating temperature of the gate dielectric layer. The effect of any proposed design change of one of the four variables (Vg, L, T or W) can be estimated by the corresponding equation (8), (9), or (10), by repeating the loop of steps 712-724 until a design having an acceptable NBTI lifetime is found.

Embodiments are described above for modeling the NBTI lifetime of a plurality of transistors, based on testing at a single stress bias voltage sufficient to cause a 10% degradation in drive current during the test period, without the need to extrapolate the length of the NBTI lifetime at the given stress bias voltage. Although examples are described herein in which the dependence of the NBTI lifetime on bias voltage, gate length, absolute temperature and gate width are used to model NBTI lifetime, the dependence of NBTI lifetime on a subset including any one or more of these four factors may be evaluated using a single stress bias, in the manner described above. Alternatively, the dependence of NBTI lifetime on other factors may be evaluated using a single stress bias, in the manner described above. Although the examples are shown graphically in the figures, the NBTI calculations described above are readily carried out automatically by a programmed processor.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention

What is claimed is:

1. Apparatus comprising:

a circuit for measuring a gate leakage current of a plurality of transistors;

a circuit for providing heat to gates of the plurality of transistors;

a circuit for applying a single stress bias voltage to the plurality of transistors for a stress period (t), the stress bias voltage causing a 10% degradation in a drive current of the transistors within the stress period (t);

a processor for estimating a negative bias temperature instability (NBTI) lifetime (τ) of the transistors based on a relationship between the gate leakage current and one or more of the group consisting of gate voltage, gate length, gate temperature, and gate width of the plurality of transistors, the relationship being determined from data observed while applying the single stress bias voltage.

2. The apparatus of claim 1, wherein the circuit for applying the single stress voltage measures the stress period (t) without extrapolating the stress period (t).

3. The apparatus of claim 1, wherein the processor is configured for:

dividing a logarithm of a gate leakage current of at least one of the transistors by a corresponding gate voltage of the transistor to determine a ratio (s) thereof; and determining a degradation slope (n), such that a change in the drive current of the transistor due to application of the single stress bias voltage is proportional to $(t)^n$;

wherein the relationship between the measured gate leakage current and the gate voltage is determined based on the ratio (s) and the degradation slope (n).

4. The apparatus of claim 3, wherein a relationship between gate length and NBTI is determined from measured gate lengths of the plurality of transistors and the degradation slope.

5. The apparatus of claim 4, wherein the processor is configured for estimating the NBTI lifetime (τ) by:

$$\ln(\tau) \sim \ln 0.1/n - (S2/n)\ln(L)$$

where L is the gate length, Ig is the gate leakage current, Id is a drain current, and S2 is calculated from a ratio of log (Ig*Id) to log (L) observed during step (c).

6. The apparatus of claim 1, wherein the processor is configured for determining an activation energy (Ea) of an NBTI failure based on a ratio of In (Jg) to (1/KTn), where Jg is the gate leakage current, T is the absolute temperature, K is Boltzman's constant, and n is a degradation slope, such that a change in the drive current of one of the transistors is due to application of the single stress bias voltage is proportional to $(t)^n$.

7. The apparatus of claim 6, wherein the NBTI lifetime is given by:

$$\ln(\tau) \sim (\ln 0.1)/n - Ea/(nKT).$$

8. The apparatus of claim 1, wherein the processor is configured for:

determining respective relationships between the measured gate leakage current and the gate voltage for at least two sets of transistors having respectively different gate widths, and estimating the NBTI lifetime (τ) of a lot of transistors based on the measured gate leakage current, a gate width of the lot of transistors, and the determined relationship corresponding to the gate width of the lot of transistors.

9. The apparatus of claim 8, wherein the NBTI lifetime (τ) is estimated by the equation:

$$\ln(\tau) \sim \ln(0.1)/n - E_a/KTn - rV_g,$$

where n is a degradation slope derived from measurements of degradation over time during the applying step, s is a ratio of gate leakage current to gate voltage, r=s/n, $E_a$=activation energy, K=Boltzmann's constant, (1.38×10−23 J/K), T=absolute temperature in Kelvins, and $V_g$=gate voltage.

10. The apparatus of claim 1, wherein:

the processor is configured for determining respective relationships between the measured gate leakage current and the gate voltage for at least two sets of transistors having respectively different gate widths, if one of the sets of transistors has a gate width greater than about 10 μm or a gate length greater than about 0.1 μm, and the other of the sets of transistors has a gate width of about 10 μm or less and a gate length of about 0.1 μm or less.

11. The apparatus of claim 1, wherein the processor is configured for determining the slopes of lines relating a logarithm of the measured gate leakage current to each of the gate voltage, gate length, gate temperature, and gate width of the plurality of transistors.

12. The apparatus of claim 1, wherein the processor is configured for accepting a lot of a product that includes the plurality of transistors, if the calculated NBTI lifetime (τ) for the plurality of transistors is greater than or equal to a threshold value.

13. The apparatus of claim 1, wherein the processor is configured for rejecting a lot of a product that includes the plurality of transistors, if the calculated NBTI lifetime (τ) is less than a threshold value.

14. The apparatus of claim 1, wherein the stress bias period is about 72 hours or less.

15. The apparatus of claim 1, wherein the processor is configured for estimating an effect on NBTI of a modification to a circuit design.

16. The apparatus of claim 15, wherein the circuit design modification affects one of the group consisting of Vg, L, T or W, where:

Vg is a voltage between the gate electrode of that transistor and ground,

L is a length of the gate,

W is a width of the gate, and

T is a absolute temperature of the gate.

17. The apparatus of claim 1, wherein the processor is configured for measuring the gate leakage current before the single stress bias voltage is applied.

18. Apparatus comprising:

a circuit for measuring a gate leakage current of a plurality of transistors;

a circuit for providing heat to gates of the plurality of transistors;

a circuit for applying a single stress bias voltage to the plurality of transistors, the stress bias voltage causing a 10% degradation in a drive current of each transistor within a respective stress period (t); and a processor configured for:

determining one or more ratios relating a logarithm of the measured gate leakage current to one or more of the group consisting of gate voltage, gate length, gate temperature, and gate width of the plurality of transistors, respectively; and estimating a negative bias temperature instability (NBTI) lifetime (τ) of the plurality of transistors based on the measured gate leakage current, and a relationship between drive current degradation and time observed during the applying step, and the one or more ratios.

19. The apparatus of claim 18, wherein the processor calculates an estimate of NBTI lifetime (τ) by the equation:

$$\ln(\tau)\sim\ln(0.1)/n-E_a/KTn-rV_g,$$

where n is a degradation slope derived from measurements of degradation over time while applying the single stress bias voltage, s is a ratio of gate leakage current to gate voltage, r=s/n, $E_a$=activation energy, K=Boltzmann'(s) constant, (1.38×10−23 J/K), T=absolute temperature in Kelvins, and $V_g$=gate voltage.

20. Apparatus comprising:

a first circuit for measuring a gate leakage current of a plurality of transistors;

a second circuit for providing heat to gates of the plurality of transistors;

a third circuit for applying a single stress bias voltage to the plurality of transistors for a stress period (t), the stress bias voltage causing a 10% degradation in a drive current of the transistor within the stress period (t);

a clock for determining a length of the stress period (t);

a fourth circuit for measuring a gate drive current applied to the plurality of transistors;

a controller coupled to the first, second, third and fourth circuits and the clock, for collecting data therefrom, and a processor coupled to the controller for estimating a negative bias temperature instability (NBTI) lifetime (τ) of the transistor based on a relationship between the gate leakage current and one or more of the group consisting of gate voltage, gate length, gate temperature, and gate width of the plurality of transistors, the relationship being determined from data observed while applying the single stress bias voltage.

* * * * *